United States Patent [19]

Fischer et al.

[11] Patent Number: 4,802,238
[45] Date of Patent: Jan. 31, 1989

[54] RADIO RECEIVER

[75] Inventors: Walter Fischer; Christian Süss, both of Vienna, Austria

[73] Assignee: U. S. Philips Corporation, New York, N.Y.

[21] Appl. No.: 36,220

[22] Filed: Apr. 9, 1987

[30] Foreign Application Priority Data

Jul. 29, 1986 [AT] Austria .................. 2041/86

[51] Int. Cl.⁴ .......................... H04B 1/16; H04B 1/26
[52] U.S. Cl. ................................ 455/188; 455/191; 455/319; 334/55; 334/45
[58] Field of Search ............... 155/188, 190, 191, 196, 155/197, 318, 319; 334/45, 47, 55, 56, 59

[56] References Cited

U.S. PATENT DOCUMENTS 4,602,222 7/1986 Wynn .............................. 334/55 X
4,710,973 12/1987 Suzuki ............................. 455/188

FOREIGN PATENT DOCUMENTS 0131718 11/1978 Japan ............................. 455/188
0122131 7/1984 Japan ............................. 455/188
0122133 7/1984 Japan ............................. 455/188
0005631 1/1985 Japan ............................. 455/188

Primary Examiner—Benedict V. Safourek
Assistant Examiner—Ralph E. Smith
Attorney, Agent, or Firm—Marianne R. Rich

[57] ABSTRACT

In a radio receiver which can be switched between at least two waveranges, the coil winding (33) of the oscillator circuit (31) has a further coil winding (36) inductively coupled to it with which a capacitor (37) is arranged in parallel for limiting the waverange comprising the higher frequencies. In the case of reception of the waverange comprising the lower frequencies this capacitor (37) is effectively arranged as a padding capacitor in series with the set of plates (34) of the variable capacitor in the oscillator circuit (31) while simultaneously the further coil winding (36) is effectively arranged in series with the coil winding (33) of the oscillator circuit (31) for the purpose of extending the range and a further capacitor (38) is effectively arranged in parallel with the set of plates (34) of a variable capacitor in the oscillator circuit (31), for the purpose of shifting the waverange of higher frequencies to the waverange of lower frequencies. This switching process is carried out with a single changeover switch (32) (FIG. 1).

4 Claims, 1 Drawing Sheet

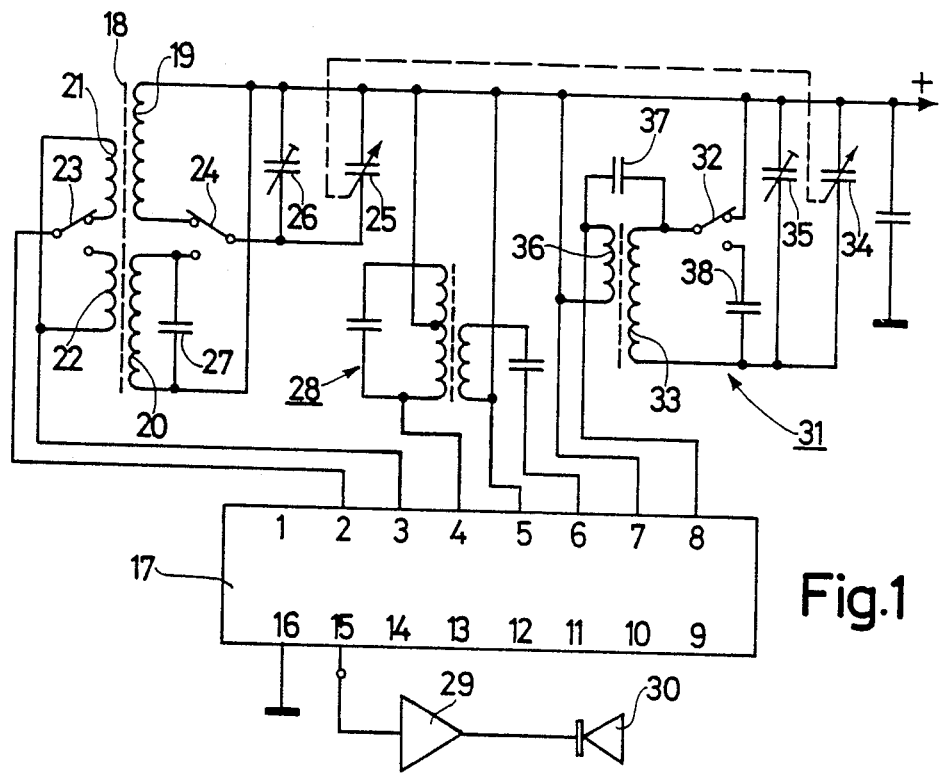
Fig.1
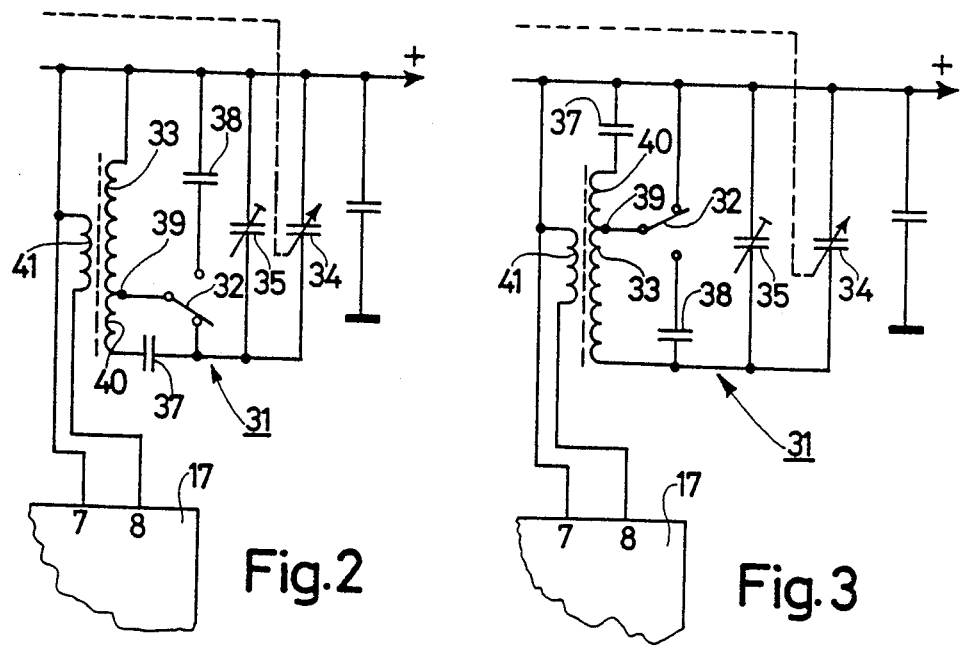
Fig.2
Fig.3

RADIO RECEIVER

The invention relates to a radio receiver which is switchable between at least two waveranges one of which comprises frequencies which are lower than those of the other, said receiver having at least two parallel resonant circuits which are each tunable by a set of plates of a variable capacitor, one circuit operating as a selection circuit and the other as an oscillator circuit, a further coil winding with a capacitor connected parallel to it in the case of at least a waverange covering higher frequencies being inductively coupled to the coil winding of the oscillator circuit, said oscillator circuit being switched to a waverange covering lower frequencies by means of a switch connecting the oscillator circuit to a further capacitor which operates parallel to the set of variable capacitor plates. In a known radio receiver of this type the further coil winding is constituted by a coupling winding on the coil winding of the oscillator circuit, whilst the capacitor is connected parallel this coupling winding not only in the case of a waverange covering higher frequencies but also in the case of a waverange covering lower frequencies. This capacitor arranged parallel to the coupling winding is used to limit the medium waverange and the long waverange. The capacitance of this capacitor arranged parallel to the coupling winding is transformed in the oscillator circuit in accordance with the square value of the transformation ratio between the coupling winding and the coil winding of this circuit. This measure enables the use of a capacitor with a capacitance higher than is possible when connecting this capacitor directly parallel to the set of variable capacitor plates of the oscillator circuit, so that the difficult process of providing capacitors having only small capacitances is avoided.

It is an object of the invention to realize a change-over between two waveranges in a radio receiver of the type described in the opening paragraph, providing the possibility of attaining predetermined frequency ranges of the two waveranges in a simple manner and ensuring a satisfactory tracking upon tuning within the two waveranges. To this end the radio receiver according to the invention is characterized in that only in the case of a waverange covering higher frequencies the capacitor is connected parallel to the further coil winding and in that the switch is a change-over switch which, when changing over to a waverange covering lower frequencies, connects the further coil winding in series with the coil winding of the oscillator circuit and which connects the last mentioned capacitor being arranged in parallel to the further coil winding in the case of a high-frequency waverange effectively in series with the set of variable capacitor plates in the oscillator circuit, said capacitor thereby constituting a padding capacitor. Thus, the further coil winding and the capacitor connected parallel thereto in the case of the waverange covering higher frequencies are doubly utilized in the two waveranges by using a simple change-over switch so that additional circuit elements for changing over between the waveranges can be dispensed with. Due to the fact that the further coil winding is arranged in series with the coil winding of the oscillator circuit the waverange covering lower frequencies is extended and a satisfactory tracking within this waverange is obtained in that the capacitor arranged in parallel with the further coil winding in the case of the waverange covering higher frequencies is now arranged in series with the set of variable capacitor plates in the oscillator circuit, thereby constituting a padding capacitor functioning in known manner. This provides a simple and low cost circuit construction.

The further coil winding may be formed, for example as a separate winding which is inductively coupled to the coil winding of the oscillator circuit. In such a case there is more freedom of dimensioning such a circuit arrangement because the number of turns and hence the inductivity of the further coil winding can be chosen, independently of other requirements in accordance with the desired frequency range of the waverange covering lower frequencies. In this connection it has been found to be advantageous if the coil winding of the oscillator circuit has a tapping with the winding segment from this tapping constituting the further coil winding and if the capacitor which is arranged parallel to the further coil winding in the case of a waverange covering higher frequencies is connected to the free end of this winding segment, and the other connection of this capacitor is connected to the set of variable capacitor plates in the oscillator circuit and only in the case of a waverange covering higher frequencies the tapping on the coil winding of the oscillator circuit including the connection of the capacitor arranged parallel to the further coil winding in the case of a waverange covering higher frequencies is connected via the change-over switch to the set of variable capacitor plates in the oscillator circuit. In this manner a very simple construction is obtained because it is easier and less expensive to manufacture a tapped winding than a separate coil winding.

In a radio receiver in which the further coil winding is a winding coupled to the coil winding of the oscillator circuit, it has been found to be very advantageous if the capacitor which is arranged parallel to the further coil winding in the case of a waverange covering higher frequencies is arranged in series with the coil winding of the oscillator circuit and if the coupling winding constituting the further coil winding and being connected to the reference potential is arranged in series with said capacitor and that only in the case of the waverange covering higher frequencies the connection of the coil winding of the oscillator circuit with the capacitor which is arranged in series therewith and which is arranged in parallel with the further coil winding in the case of the waverange covering higher frequencies is connected to the reference potential via the change-over switch. In this manner the coupling winding which is already present is additionally utilized for a change-over of the waveranges so that a very simple and low-cost circuit construction is obtained.

The invention will now be described in greater detail by way of example with reference to the accompanying drawings.

FIG. 1 shows the circuit diagram of a radio receiver which can be switched between a medium waverange, i.c. a waverange covering higher frequencies, and a long waverange, i.c. a waverange covering lower frequencies, and in which the coupling winding coupled to the winding of the coil of the oscillator circuit is additionally utilized for changing over the waveranges.

FIG. 2 shows an oscillator circuit in a sectional view of the circuit diagram of FIG. 1 in which the winding of the coil of this circuit has a tapping and in which a winding segment from this circuit is connected via a capacitor (additional capacitor means) to the end of the oscillator circuit remote from the reference potential.

FIG. 3 shows a modification of the embodiment of an oscillator circuit according to FIG. 2 in which the winding segment from the tapping on the coil winding of the oscillator circuit is connected to the reference potential via a capacitor.

In FIG. 1 the reference numeral 17 denotes an integrated circuit for processing radio-frequency and intermediate-frequency signals in a radio receiver for the reception of amplitude-modulated or frequency-modulated signals. Such an integrated circuit is commercially available under type number TEA 5570. In the relevant embodiment only the part of this integrated circuit which is used for processing amplitude-modulated signals is utilized. The radio receiver can be switched between two waveranges, namely between a medium waverange and a long waverange. For receiving the signals in these two waveranges a ferrite rod antenna is provided which is denoted by the broken line 18 in FIG. 1. A winding 19 of a coil for medium-wave reception and a winding 20 of a coil for long-wave reception are arranged on this ferrite rod antenna. Coupling windings 21 and 22 are coupled to the windings 19 and 20, respectively of these two coils. These coupling windings 21 and 22 are connected together at one end and lead to the terminal 3 of the integrated circuit 17. The other ends of the two coupling windings 21 and 22 are connected to a contact of a change-over switch 23 whose center contact is connected to the connection 2 of the integrated circuit 17. The windings 19 and 20 of the two coils arranged on the ferrite rod antenna are connected at one end to the reference potential, in this case the positive rail of the supply voltage, and at the other end to a contact of a further change-over switch 27 whose center contact is connected to a set of plates 25 of a variable capacitor which also leads to the reference potential. As is usual, this configuration results in two tunable parallel resonant circuits operating as selection circuits between which switching is possible by means of the change-over switches 23 and 24. The switching positions for the medium wave reception are shown in FIG. 1. As is also usual, a trimmer 26 is arranged in parallel with the set of plates 25 of the variable capacitor for the purpose of range adjustment and a capacitor 27 is arranged in parallel with the winding 20 of the coil for the purpose of changing over from the medium-wave to the long-wave range.

The radio-frequency signals applied to the terminals 2 and 3 of the integrated circuit 17 are converted in a conventional manner into an intermediate-frequency signal in a mixer stage, which signal is applied from terminal 4 of the integrated circuit 17 to an intermediate-frequency selection circuit 28 and is supplied to the terminal 6 of the integrated circuit 17 whereafter it is demodulated in the circuit. The low-frequency signal obtained in this manner is available at the terminal 15 of the integrated circuit 17, whence it is applied to an amplifier 29 and finally to a loudspeaker 30. This low-frequency section of the radio receiver includes, for example a volume and tone control which are not shown in the figure.

To obtain the intermediate-frequency signal in the mixer stage arranged in the integrated circuit 17 an oscillator signal which is obtained in an oscillator likewise arranged in the integrated circuit 17 is to be applied in a convential manner to this mixer stage. For this purpose the terminals 7 and 8 of the integrated circuit 17 have a tunable oscillator circuit 31 connected thereto which can be switched between medium-wave reception and long-wave reception by means of a further change-over switch 32. This oscillator circuit 31 has a coil winding 33 and a further set of plates 34 of the variable capacitor, whilst a trimmer 35 is arranged in parallel with the latter. A further coil winding, which in this case is constituted by a coupling winding 36 on the oscillator in the integrated circuit 17, is inductively coupled to the winding 33 of the coil of the oscillator circuit 31. Thus, this coupling winding 36 is connected to the terminals 7 and 8 of the integrated circuit. One end of the coupling winding 36 and one terminal of each set of plates 34 of the variable capacitor and of the trimmer 35 are connected to the reference potential.

Furthermore a capacitor 37 is arranged in series with the winding 33 of the coil of the oscillator circuit 31 and a coupling winding 36 constituting the further coil winding is connected in series with this capacitor, which coupling winding is connected to the reference potential. Finally the connection of the winding 33 of the coil of the oscillator circuit 31 and the capacitor 37 arranged in series therewith is connected to the center contact of the further change-over switch 32 on contact of which is connected to the reference potential and the other contact of which is connected to a further capacitor 38 the other terminal of which is connected to the connection of the set of plates 34 of the variable capacitor and the coil winding 33 of the oscillator circuit 31.

In the position of the change-over switches 23, 24 and 32 shown in FIG. 1 and corresponding to medium-wave reception the change-over switch 32 is in the position in which its contact establishes a connection with the reference potential. In this manner the connection of the coil winding 33 of the oscillator circuit 31 and the capacitor 37 arranged in series therewith is connected to reference potential. This results in the capacitor 37 being arranged in parallel with the coupling winding 36 constituting of further coil winding, and in the winding 33 of the oscillator circuit 31 as well as its set of plates 34 of the variable capacitor leading to the reference potential. The capacitance of the capacitor 37 is then transformed in the oscillator circuit in accordance with the square value of the transformation ratio between the coupling winding and the coil winding of this oscillator circuit in which the capacitor is then active parallel to the set of plates 34 of the variable capacitor and thus limits the medium waverange in known manner. Due to the transformation of the capacitance of capacitor 37 it should be dimensioned with a capacitance which is larger than if it were arranged directly parallel to the set of plates 34 of the variable capacitor.

In the other position of the change-over switches 23, 24 and 32 corresponding to long-wave reception the change-over switch 32 is connected to the contact to which the further capacitor 38 is connected, which results in this capacitor 38 being connected to the connection of the coil winding 33 of the oscillator circuit 31 and the capacitor 37 arranged in series therewith while eliminating the connection to the reference potential as was the case for medium-wave reception. It is thereby achieved that the coupling winding 36 constituting the further coil winding is effectively arranged in series with the coil winding 33 of the oscillator circuit 31 so that the inductance active in the oscillator circuit 31 is increased which results in an extension of the long wave-range. Furthermore it is achieved that the capacitor 37 is now effectively arranged in series with the set of plates 34 of the variable capacitor in the oscillator circuit 31 so that it takes over the function of a padding capacitor and thus produces a satisfactory tracking within the long waverange. Finally it is achieved that the capacitor 38 is arranged in parallel to the coil winding 33 of the oscillator circuit 31, which means that its capacitance is transformed in the oscillator circuit 31 and thus becomes active parallel to the set of plates 34 of the variable capacitor so that the required waverange shift from medium-wave to long-wave is realized in known manner.

In this simple manner, for example a medium waverange of 512 KHz to 1632 KHz and a long waverange of 147 KHz to 285 KHz can be realized without any additional circuit elements and with a satisfactory tracking, even in the long waverange, as a result of the known action of a padding capacitor. The above-mentioned measures are of course also applicable when switching over between waveranges other than medium-wave and long-wave such as, for example for the change-over between two short waveranges. Likewise the changeover switch 32 switching the oscillator circuit 31 may be incorporated in a different way in the oscillator circuit while principally functioning in the same manner in that its center contact is connected to the reference potential and in that one of its contacts is connected to the connection of the coil winding 33 of the oscillator circuit and the capacitor 37 arranged in series therewith and its other contact is again connected to the further capacitor 38 which will when be directly arranged in parallel with the set of plates 34 of the variable capacitor in the oscillator circuit 31 in the case of long wave reception.

In the embodiment of FIG. 2 the coil winding 33 of the oscillator circuit 31 has a tapping 39 with the winding segment 40 from this tapping constituting the further coil winding which is inductively coupled to the coil winding 33 of the oscillator circuit. The capacitor 37, which has its other terminal connected to the set of plates 34 of the variable capacitor in the oscillator circuit 31, is connected to the free end of this winding segment 40. The change-over switch 32 is incorporated in the oscillator circuit 31 in such a way that its center contact is connected to the tapping 39 on the coil winding 33 of the oscillator circuit, and one of its contacts is connected to the connection of the capacitor 37 and the set of plates 34 of the variable capacitor and its other contact is connected to the capacitor 38 which, likewise as the coil winding 33 of the oscillator circuit 31 and its set of plates 34 of the variable capacitor, leads to the reference potential. For coupling the oscillator circuit 31 to the integrated circuit 17, a separate coupling winding 41 is provided which is likewise inductively coupled to the coil winding 33 of the oscillator circuit 31 which is not further used in this case with respect to the change-over of waveranges. If desired, and if permissible with respect to the integrated circuit 17, a further tapping could be provided on the coil winding 33 of the oscillator circuit instead of such a separate coupling winding.

In the position of the change-over switch 32 shown in FIG. 2 and corresponding to medium-wave reception this switch establishes a connection between the tapping 39 and the connection of the capacitor 37 and the set of plates 34 of the variable capacitor. In this way the capacitor 37 is arranged parallel to the further winding segment 40 constituting the further coil winding and the end of the winding 33, constituted by the tapping 39, of the oscillator circuit 31 remote from the reference potential is connected to the terminal of the set of plates 34 of the variable capacitor in the oscillator circuit 31 likewise remote from the reference potential. The capacitance of the capacitor 37 is then again transformed in the oscillator circuit 31 in accordance with the square value of the transformation ratio between the winding segment 40 and the coil winding 33 of the oscillator circuit in which it is then active parallel to the set of plates 34 of the variable capacitor and thus again limits the medium waverange.

In the other position of the change-over switch 32 corresponding to long-wave reception this switch establishes a connection between the tapping 39 and the capacitor 38 so that the capacitor 38 is arranged parallel to the coil winding 33 of the oscillator circuit 31, which means that its capacitance is transformed in the oscillator circuit and thus becomes active parallel to the set of plates 34 of the variable capacitor in the oscillator circuit 31 so that the required medium-wave to long-wave range shift is realized. Furthermore it is achieved that the winding segment 40 constituting the further coil winding is arranged in series with the coil winding 33 of the oscillator circuit 31 so that the inductance active in the oscillator circuit is increased again, which results in an extension of the long waverange. Besides, the capacitor 37 is arranged in series with the set of plates 34 of the variable capacitor in the oscillator circuit 31 so that it takes over the function of a padding capacitor and thus ensures a satisfactory tracking within the long waverange. Since in the embodiment shown the winding segment 40 constituting the further coil winding and the separate coupling winding 41 can be dimensioned independently of each other, there is more freedom in the construction of the separate circuit elements for attaining the desired frequency ranges of the two waveranges.

The embodiment of FIG. 3 is distinguished from that of FIG. 2 only in that the winding segment 40 constituting the further coil winding is connected via the capacitor 37 to the reference potential and in that the reference potential is connected to one contact of the change-over switch 32 and the capacitor 38 connected to the other contact of the change-over switch 32 is connected to the end of the oscillator circuit 31 remote from the reference potential. The operation of the oscillator circuit according to this embodiment is entirely analogous to that of the oscillator circuit according to the embodiment shown in FIG. 2, though other circuit elements are connected to the reference potential, which may be advantageous. As has been stated with respect to the embodiment shown in FIG. 1, the change-over switch 32 in the embodiments shown in FIGS. 2 and 3 could also be included in the oscillator circuit in such a way that in the case of long-wave reception it could arrange the capacitor 38 directly parallel to the set of plates 34 of the variable capacitor in the oscillator circuit 31. As is evident, the embodiments described above may have various modifications without passing beyond the scope of the invention.

What is claimed is:

1. In a radio receiver switchable between at least a first and a second waverange, said first waverange covering frequencies lower than those covered by said second waverange, said receiver having a selection circuit having a first resonant circuit, an oscillator circuit comprising a second resonant circuit having an oscillator coil, a further coil winding inductively coupled to said oscillator coil, and first and second jointly operable variable capacitor means for tuning said selection circuit and said oscillator circuit, respectively, the improvement comprising:

additional capacitor means;

and changeover switch means for connecting said further coil winding in series with said oscillator coil and said additional capacitor means in series with said second variable capacitor means when said receiver is operable in said first wave range, and for connecting said additional capacitor means in parallel with said further coil winding when said receiver is operable in said second wave range.

2. A radio receiver as claimed in claim 1, further comprising further capacitor means;

and wherein said changeover switch means further comprises means for connecting said further capacitor means in parallel with said oscillator coil when said receiver is operable in said first waverange.

3. In a radio receiver switchable between at least a first and a second waverange, said first waverange covering frequencies lower than those covered by said second waverange, said receiver having a selection circuit having a first resonant circuit, an oscillator circuit comprising a second resonant circuit having an oscillator coil, a further coil winding inductively coupled to said oscillator coil, and first and second jointly operable variable capacitor means for tuning said selection circuit and said oscillator circuit, respectively, a further coil winding inductively coupled to said oscillator coil, the improvement comprising:

further capacitor means;

wherein said oscillator circuit has a tapped winding having a tap, a first winding segment constituting said oscillator coil and a second winding segment having a free end and constituting said further coil winding;

wherein said additional capacitor means has a first terminal connected to said free end of said second winding segment and a second terminal connected to said second variable capacitor means;

and selector switch means for connecting said further capacitor means is parallel with said oscillator coil when said receiver is operable in said first waverange, and for connecting said tap on said winding to said variable capacitor means when said receiver is operable in said second waverange.

4. In a radio receiver switchable between at least a first and a second waverange, said first waverange covering frequencies lower than those covered by said second waverange, said receiver having a selection circuit having a first resonant circuit, an oscillator circuit comprising a second resonant circuit having an oscillator coil, a further coil winding inductively coupled to said oscillator coil, and first and second jointly operable variable capacitor means for tuning said selection circuit and said oscillator circuit, respectively, a further coil winding inductively coupled to said oscillator coil, the improvement comprising:

further capacitor means;

means for connecting said additional capacitor means in series with said further coil winding and said further coil winding in series with said oscillator coil at a winding tap;

and selector switch means for connecting said winding tap to reference potential when said receiver is operable in said second waverange, and for connecting said further capacitor means in parallel with said oscillator coil when said receiver is operable in said first waverange.

* * * * *